(12) United States Patent
Beccue et al.

(10) Patent No.: US 8,487,710 B2
(45) Date of Patent: Jul. 16, 2013

(54) RTWO-BASED PULSE WIDTH MODULATOR

(75) Inventors: Stephen Beccue, Thousand Oaks, CA (US); Andrey Martchovsky, Fremont, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/316,994

(22) Filed: Dec. 12, 2011

(65) Prior Publication Data

US 2013/0147569 A1 Jun. 13, 2013

(51) Int. Cl.
*H02M 1/12* (2006.01)
*G05F 1/40* (2006.01)
*H03L 7/00* (2006.01)
*H03K 7/08* (2006.01)

(52) U.S. Cl.
USPC .................. 332/109; 323/282; 363/41; 331/2

(58) Field of Classification Search
USPC .......... 363/41; 323/282, 283; 332/109; 331/2
See application file for complete search history.

(56) References Cited

U.S. PATENT DOCUMENTS

| | | | |
|---|---|---|---|
| 5,302,920 A | 4/1994 | Bitting | |
| 5,584,067 A | 12/1996 | V. Buer et al. | |
| 5,592,126 A | 1/1997 | Boudewijns et al. | |
| 5,652,549 A | 7/1997 | Unterricker et al. | |
| 5,825,211 A | 10/1998 | Smith et al. | |
| 6,002,274 A | 12/1999 | Smith et al. | |
| 6,150,886 A | 11/2000 | Shimomura | |
| 6,157,037 A | 12/2000 | Danielson | |
| 6,259,747 B1 | 7/2001 | Gustafsson et al. | |
| 6,281,759 B1 | 8/2001 | Coffey | |
| 6,323,737 B1 | 11/2001 | Broekaert | |
| 6,396,359 B1 | 5/2002 | Hajimiri et al. | |
| 6,426,662 B1 | 7/2002 | Arcus | |
| 6,566,968 B2 | 5/2003 | Afghahi | |
| 6,781,424 B2 | 8/2004 | Lee et al. | |
| 6,856,208 B2 | 2/2005 | Lee et al. | |
| 6,870,431 B2 | 3/2005 | Afghahi | |
| 6,900,699 B1 | 5/2005 | Kim | |
| 6,943,599 B2 | 9/2005 | Ngo | |
| 6,995,620 B2 | 2/2006 | Afghahi | |
| 7,005,930 B1 | 2/2006 | Kim et al. | |
| 7,085,668 B2 | 8/2006 | Johnson | |

(Continued)

OTHER PUBLICATIONS

Wood et al., *Rotary Traveling-Wave Oscillator Arrays: A New Clock Technology*, IEEE Journal of Solid-State Circuits, vol. 36, No. 11, Nov. 2001, 12 pages.

*Primary Examiner* — Joseph Chang
(74) *Attorney, Agent, or Firm* — Knobbe Martens Olson & Bear LLP

(57) ABSTRACT

A pulse width modulator based on a pair of rotary traveling wave oscillators. The first oscillator operates freely or as part of a phase-locked loop. The second oscillator operates at the same frequency as the first oscillator, but with a controllable phase offset from the first oscillator. The phase offset is set by an input voltage. A block takes the outputs of the first and second oscillators and combines them so that the output is a pulse whose width is the overlap of the oscillation signals from the first and second oscillators. The output pulse width is thus a function of the input voltage. When the pulse width modulator receives the input voltage from the output of a switching power supply, it can use the modulated pulse width to control the switching transistor of the power supply to maintain the output at a regulated voltage.

20 Claims, 14 Drawing Sheets

U.S. PATENT DOCUMENTS

| | | | |
|---|---|---|---|
| 7,088,154 B2 | 8/2006 | Ngo | |
| 7,091,802 B2 | 8/2006 | Ham et al. | |
| 7,130,604 B1 | 10/2006 | Wong et al. | |
| 7,224,199 B1 | 5/2007 | Kang | |
| 7,224,235 B2 | 5/2007 | De Ranter et al. | |
| 7,242,272 B2 | 7/2007 | Ham et al. | |
| 7,274,262 B2 | 9/2007 | Ham et al. | |
| 7,295,076 B2 | 11/2007 | Kim et al. | |
| 7,307,483 B2 | 12/2007 | Tzartzanis et al. | |
| 7,315,219 B2 | 1/2008 | Chiang | |
| 7,339,439 B2 | 3/2008 | Roubadia et al. | |
| 7,378,893 B1 | 5/2008 | Kang | |
| 7,397,230 B2 | 7/2008 | Tabaian et al. | |
| 7,409,012 B2 | 8/2008 | Martin et al. | |
| 7,446,578 B2 | 11/2008 | Huang | |
| 7,471,153 B2 | 12/2008 | Kee et al. | |
| 7,482,884 B2 | 1/2009 | Wang et al. | |
| 7,504,895 B2 | 3/2009 | Neidorff | |
| 7,511,588 B2 | 3/2009 | Gabara | |
| 7,513,873 B2 | 4/2009 | Shifrin | |
| 7,515,005 B2 | 4/2009 | Dan | |
| 7,541,794 B2 | 6/2009 | Tabaian et al. | |
| 7,551,038 B2 | 6/2009 | Jang et al. | |
| 7,571,337 B1 | 8/2009 | Zhai et al. | |
| 7,577,225 B2 | 8/2009 | Azadet et al. | |
| 7,609,756 B2 | 10/2009 | Wood | |
| 7,612,621 B2 | 11/2009 | Kim et al. | |
| 7,616,070 B2 | 11/2009 | Tzartzanis et al. | |
| 7,656,239 B2 | 2/2010 | Bietti et al. | |
| 7,656,336 B2 | 2/2010 | Wood | |
| 7,656,979 B2 | 2/2010 | Leydier et al. | |
| 7,663,328 B2 | 2/2010 | Gonder | |
| 7,715,143 B2 | 5/2010 | Bliss et al. | |
| 7,741,921 B2 | 6/2010 | Ismailov | |
| 7,782,988 B2 | 8/2010 | Ziesler | |
| 7,833,158 B2 | 11/2010 | Bartz | |
| 7,847,643 B2 | 12/2010 | Da Dalt | |
| 7,885,625 B2 | 2/2011 | Muhammad et al. | |
| 7,893,778 B2 | 2/2011 | Mohtashemi et al. | |
| 7,907,023 B2 | 3/2011 | Liang et al. | |
| 7,911,284 B2 | 3/2011 | Kuwano | |
| 7,924,076 B2 | 4/2011 | Suzuki et al. | |
| 7,936,193 B2 | 5/2011 | Van Der Wel et al. | |
| 7,944,316 B2 | 5/2011 | Watanabe et al. | |
| 7,952,439 B1 | 5/2011 | Heggemeier et al. | |
| 7,973,609 B2 | 7/2011 | Ohara et al. | |
| 7,978,012 B2 * | 7/2011 | Wood | 331/2 |
| 7,995,364 B2 | 8/2011 | Shiu | |
| 8,008,981 B2 | 8/2011 | Hong et al. | |
| 8,049,563 B2 | 11/2011 | Aoki et al. | |
| 2006/0208776 A1 | 9/2006 | Tonietto et al. | |
| 2008/0074202 A1 | 3/2008 | Gabara | |
| 2009/0015215 A1 * | 1/2009 | Ajram et al. | 323/234 |
| 2009/0322394 A1 | 12/2009 | Song et al. | |
| 2010/0117744 A1 | 5/2010 | Takinami et al. | |
| 2010/0156549 A1 | 6/2010 | Uemura et al. | |
| 2010/0321121 A1 | 12/2010 | Mohtashemi | |
| 2011/0095833 A1 | 4/2011 | Mohtashemi et al. | |
| 2011/0156760 A1 | 6/2011 | Bhuiyan et al. | |
| 2011/0156773 A1 | 6/2011 | Beccue | |
| 2011/0195683 A1 | 8/2011 | Brekelmans et al. | |
| 2011/0286510 A1 | 11/2011 | Levantino et al. | |
| 2012/0008717 A1 | 1/2012 | van Sinderen et al. | |
| 2012/0013363 A1 | 1/2012 | Takinami et al. | |
| 2012/0013407 A1 | 1/2012 | Takinami et al. | |
| 2012/0025918 A1 | 2/2012 | Wang et al. | |

* cited by examiner

RTWO-BASED PULSE WIDTH MODULATOR

CROSS-REFERENCE TO RELATED APPLICATIONS

1. Field of the Invention

The present invention relates generally to pulse width modulators and more specifically to pulse width modulators employing at least one rotary traveling wave oscillator.

2. Description of the Related Art

DC to DC converters commonly include a switching transistor connected to a filter circuit and a control circuit. FIG. 1A shows a simple converter configuration 100. The converter includes a switching transistor 102, a diode 104, an inductor 106, and a capacitor 108. The switching transistor 102 is connected between the primary energy source 110, such as a battery, and a low pass filter circuit 112, which is formed by the inductor 106 and capacitor 108, as shown. In this type of converter, the inductor 106 also functions as an energy storage element. The capacitor 108 is connected across the load 112 and is used to filter out voltage variations (ripple) at the load 112 that would otherwise occur. Typically, a diode 104 is connected across the filter circuit 113 and the control circuit 114 is connected to the output and to the switching transistor 102.

Such a converter operates with at least two phases, defined by the state of the switching transistor 102. During a first phase when the switching transistor 102 is on, energy is transferred from a primary energy source 110, such as a battery, to a storage element 106, and in this particular case to the capacitor 108 and the load 112. During a second phase when the switch is off, energy is transferred from the storage element 106 to the capacitor 108 and the load 112 and the diode 104 operates to maintain continuity of current.

The control circuit 114 of the converter 100 has two important tasks. It must monitor the voltage vl 118 at the load 112 and it must compare the monitored voltage to a reference voltage. The output of such a comparison is a control voltage vc. Based on the comparison signal vc internal to the control circuit, the control circuit must create a switch control signal d 116 that sets the on and off times during a switching cycle of the switching transistor 102 to compensate for changes in the primary energy source 110 or the load 112. Controlling the on and off times of the switching transistor 102 is called duty cycle control, when the cycle frequency is fixed. A signal derived from the duty cycle control signal d 116 then drives the switching transistor 102. Thus, the control circuit 114 must convert the comparison signal vc to a duty cycle control signal d 116.

A common circuit that performs the conversion from the comparison signal to the duty cycle control signal (vc→d) is a pulse width modulator (PWM). The modulator receives the comparison signal and alters the duty cycle control signal usually in a linear fashion, between a minimum and a maximum duty cycle. For example, if the comparison signal vc ranges from 1.0 to 4.0 volts, the duty cycle control signal d ranges from 10% to 95%. A pulse width modulator operates at some preset switching frequency so that the duty cycle fixes the maximum on and off times of the switching transistor.

Switching frequencies from 100 to 200 KHz are common. Switching frequencies determine the size of the energy storage inductor 106 and filter capacitor 108 shown in FIG. 1A. At 200 KHz, an inductor may have a value of 5 µH and a capacitor a value of 2000 µF. At higher switching frequencies, the values and thus sizes of these components can become much smaller.

However, high switching frequencies affect the power lost in driving the switching transistor. Common types of transistors used for the switching transistor include the MOSFET, the IGBT, and the BJT. When the transistor is a MOSFET, these power losses arise from the input capacitance of the MOSFET. During turn on and turn off, the input capacitance of a MOSFET is a combination of a gate-to-source capacitance Cgs and a gate-to-drain capacitance Cgd, both of which vary with the voltage across them because their capacitance derives in part from the depletion layers in the transistor. The greatest variation in capacitance comes from Cgd, which can vary by a factor of 10 to 100 as a function of the drain-to-gate voltage, $V_{DG}$ ($\approx V_{DS}$). Charging and discharging these capacitances causes a power loss in the converter according to the relation $CV^2 f$, where V is the voltage output of the driver and f is the switching frequency, and C is the combination of the Cgs and Cgd capacitances at the voltages across them. Values for Cgs might be about 1000 pF and for Cgd about 150 pF to 1500 pF. If the switching frequency is about 200 KHz, then the power lost in charging and discharging the capacitance of a single switching transistor is about 6 to 12 milliwatts (assuming a 5 Volt swing). The losses due to switching rise linearly with the frequency of operation and affect the efficiency of the converter at low load currents.

As mentioned above, a diode is used in combination with the switching transistor to maintain current continuity in the converter. However, diodes also contribute to power losses, thus lowering the efficiency of the converter. For example, if the voltage drop across a diode is about 1 volt with 5 A of current flowing through it, the loss is 5 Watts. This is a serious problem at low loads because the power loss in the diode can be a large fraction of the power delivered to the load, causing low efficiency. Therefore, it is common to replace the diode with a synchronous rectifier. This is shown in FIG. 1B, where a transistor 152 replaces the diode 104 in FIG. 1A and connects via d2 156 to the control circuit 154. When the switching transistor 102 is off, the control circuit 154 turns on the synchronous rectifier 152 to maintain continuity of current in the circuit. The synchronous rectifier arrangement substantially lowers the power that would have been dissipated in the diode, because the on-resistance of the transistor 152 can be very small. The on-resistance $r_{DS(on)}$ of the transistor 152 ranges from 0.01 to 0.1 ohms. However, the additional transistor 152 also causes a frequency-dependent power loss because the control circuit 154 must charge and discharge the input capacitance of the transistor 152.

Also as mentioned above, many converters operate with two phases. Additional phases can improve the converter in at least three ways. First, the additional phases can lower the time to bring the load back into regulation after a significant change in the load occurs. Instead of waiting for multiple switching cycles to occur, the converter need only wait for the additional phases to occur. Second, additional phases can permit the combining of multiple converters so that output currents higher than those obtainable from a single converter are possible. Third, output ripple tends to be smaller in a multiphase converter, making such a converter suitable for a wider variety of applications. However, each additional phase requires at least one additional switch, again increasing $CV^2 f$ dissipation.

Given the above considerations, it would be desirable to have a very high frequency power converter, synchronously switched and operating with multiple phases.

BRIEF SUMMARY OF THE INVENTION

In one embodiment, the present invention is a pulse-width modulator (PWM) formed from a pair of RTWOs. The RTWOs drive the switches of a power converter.

One advantage of the present invention are that $CV^2f$ losses are eliminated. Instead, a small RTWO power overhead is incurred, as the capacitances of the switches become part of the capacitance of the RTWO.

Another advantage is that the RTWOs can operate at very high frequencies, permitting components to become physically much smaller.

Yet another advantage is that synchronous rectifiers are easily driven from the same RTWOs as the switches.

Yet another advantage is that phase shifts that optimally time the synchronous rectifiers are achieved with RTWO phasing and there is no additional $CV^2f$ penalty when driven with RTWOs.

Yet another advantage is that poly phase power supplies simply tap uniform phases on the RTWO, with no significant increase in $CV^2f$ loss.

Yet another advantage is that devices will operate in series.

BRIEF DESCRIPTION OF THE DRAWINGS

These and other features, aspects and advantages of the present invention will become better understood with regard to the following description, appended claims, and accompanying drawings where:

DETAILED DESCRIPTION OF THE INVENTION

Figure 1A:
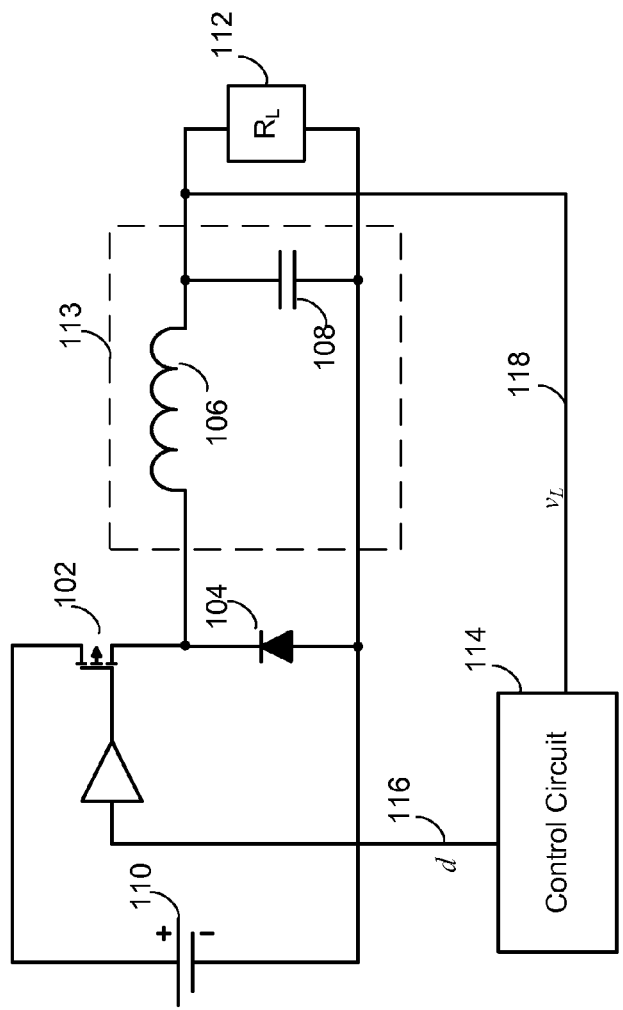
FIG. 1A shows a conventional step down converter.
Figure 1B:
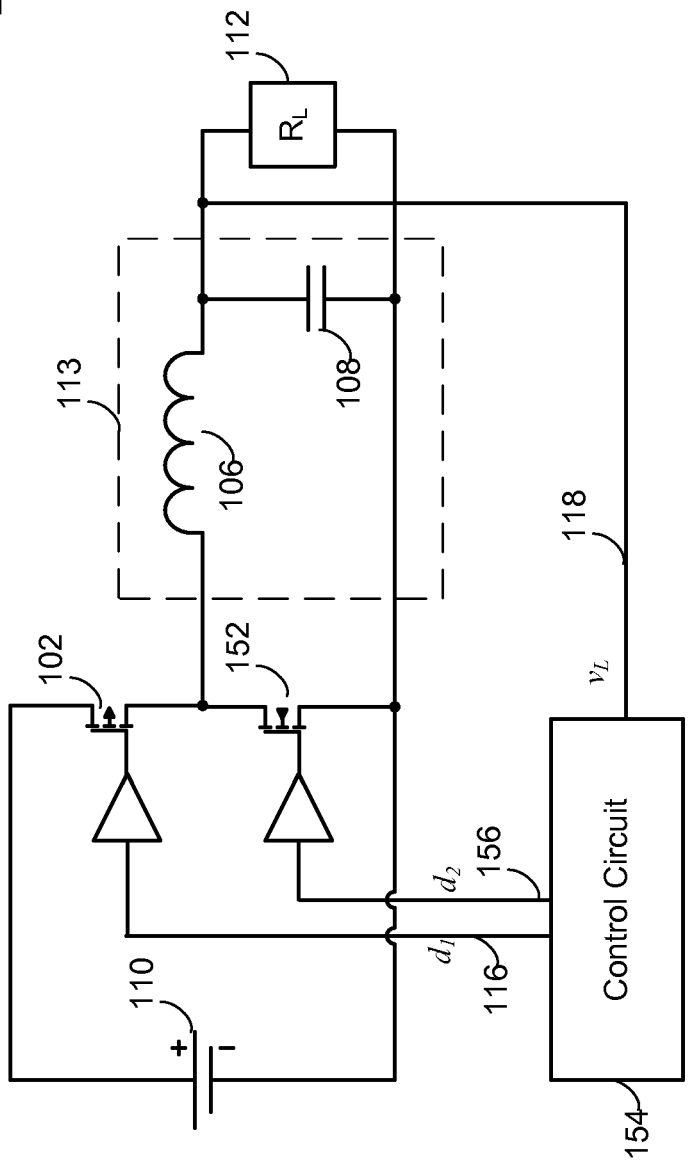
FIG. 1B shows a conventional step down converter with a synchronous rectifier.
Figure 2A:
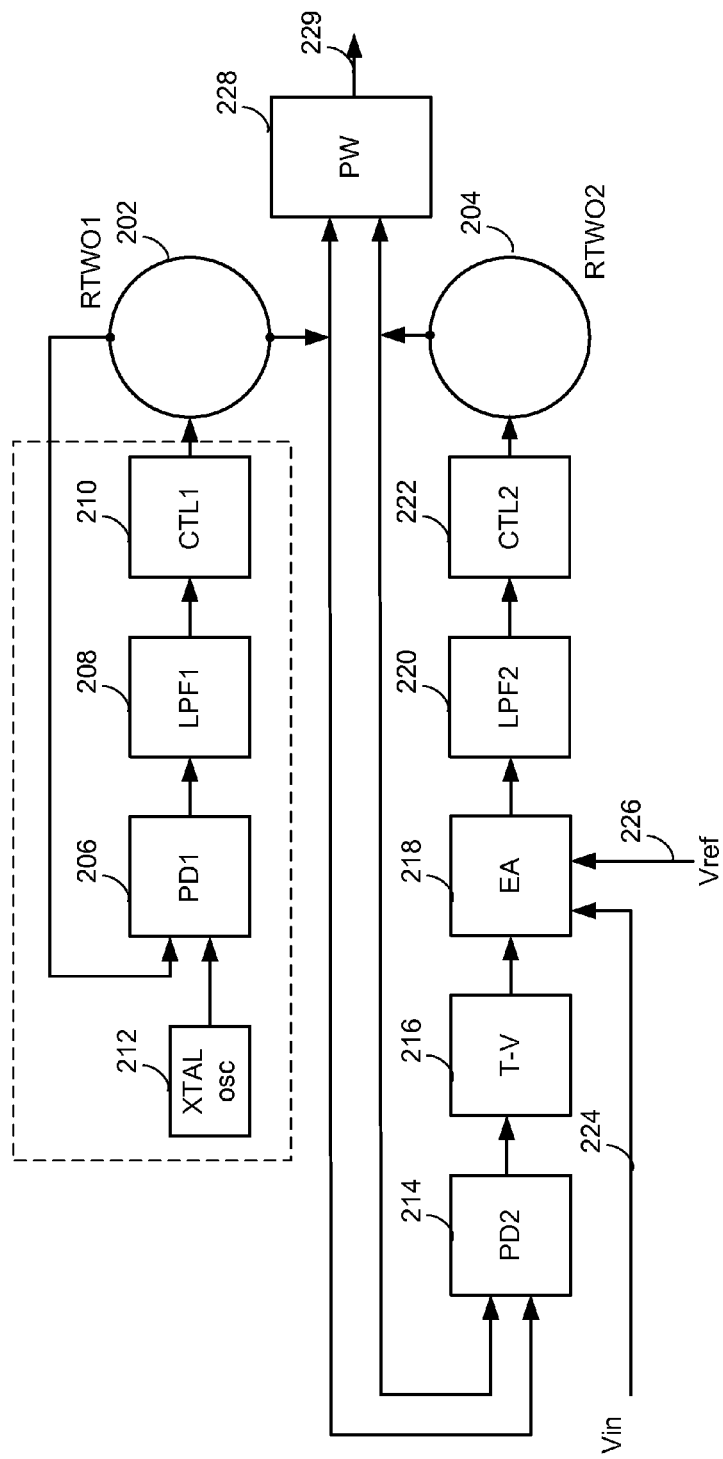
FIG. 2A shows one embodiment of the present invention.

One embodiment 200 of the present invention is a pulse-width modulator. FIG. 2A shows the arrangement of blocks for achieving this function. The arrangement includes a first RTWO1 202 and a second RTWO2 204. The RTWO1 202 may run freely or optionally be phase-locked to a reference such as a crystal oscillator 212. When RTWO1 202 operates in a phase-locked loop, blocks PD1 206, LPF1 208 and CTL1 210 are included. Block PD1 206 is a phase detector which determines the difference in phase between crystal oscillator output and the RTWO1 output. Block LPF1 208 is a low pass filter which averages out the output of the PD block. Block CTL1 210 is a control block that adjusts the RTWO1 202 so that its frequency and phase matches that of the crystal oscillator 212. The first RTWO 202 sets the operating frequency of the PWM.

The RTWO2 204 operates to generate a phase that is offset by a controlled amount from the phase of RTWO1 202. The phase offset is controlled by the PD2 214, T-V 216, EA 218, LPF2 220, and CTL2 222 blocks and Vin 224. The PD2 block 214 detects the phase difference between the RTWO1 202 and RTWO2 204 outputs. The T-V block 216 converts the output of the PD2 block 214 into a voltage. The EA block 218 amplifies (a) the difference (Verror=Vref−Vin) between a reference voltage Vref 226 and the input voltage Vin 224, properly scaled, to create an error voltage Verror, and the (b) difference between the T-V block 216 output and Verror 228. The LPF2 block 220 filters the output of the EA block 218. The CTL2 block 222 alters the phase and/or frequency of the RTWO2 204 to have an offset that is, in effect, set by the Verror signal.

Figure 2B:
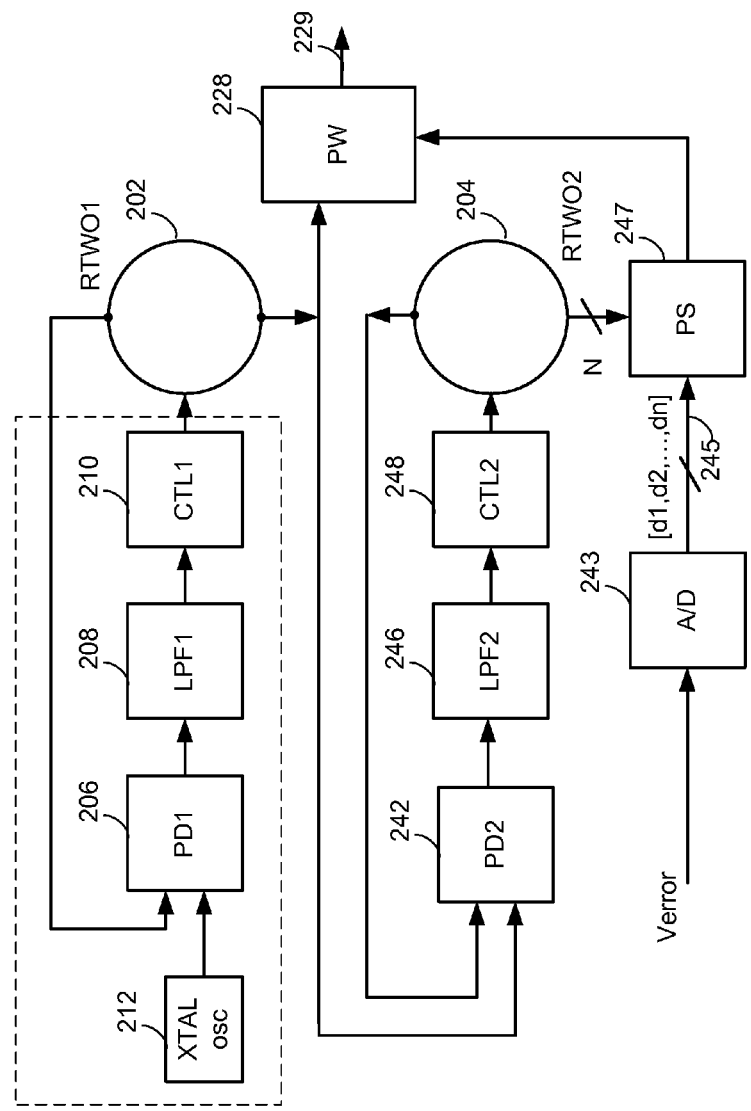
FIG. 2B shows another embodiment of the present invention.
Figure 2C:
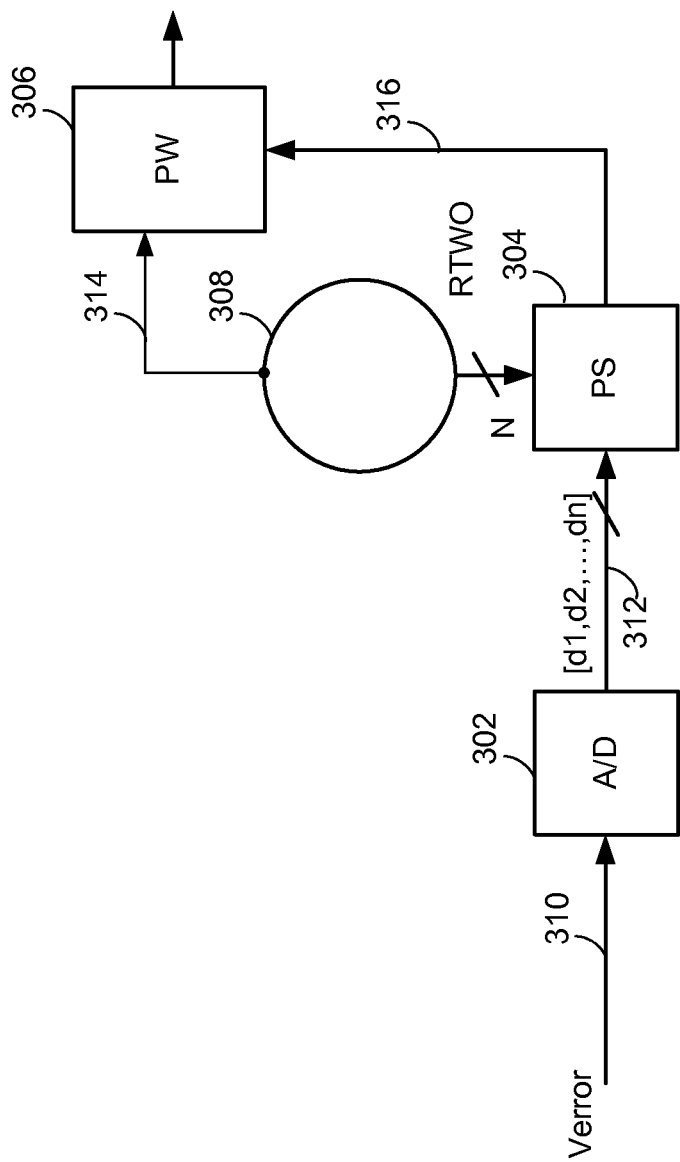
FIG. 2C shows yet another embodiment of the present invention.
Figure 2D:
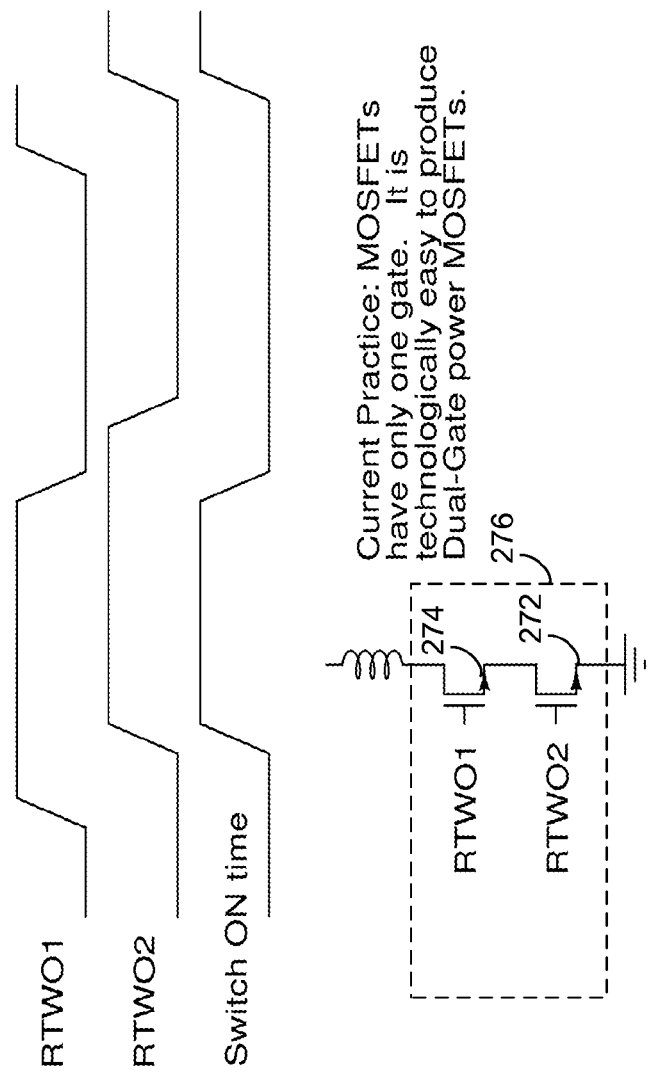
FIG. 2D shows an implementation of the PW block.
Figure 2E:
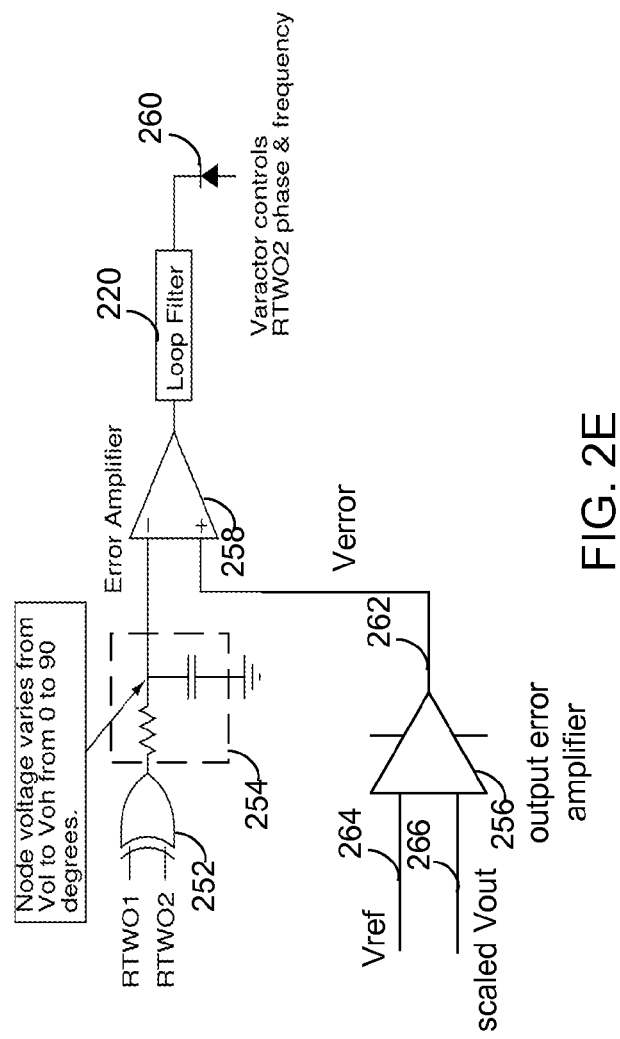
FIG. 2E shows an implementation of the PD2, T-V, EA, LPF2, and CTL blocks.

FIG. 2E shows one embodiment 250 of the PD2 214, T-V 216, EA 218, LPF2 220, and CTL blocks 222. The PD2 block 214 includes the exclusive-OR gate (XOR) 252, whose function in the circuit is described in more detail below. The T-V block 216 includes an RC filter 254. The EA block 218 includes a first error amplifier 256 for boosting the difference (Verror) between a scaled Vout and Vref, and a second error amplifier 258 for boosting the difference between the first error amplifier 256 output (Verror) and the filtered output via 254 of the exclusive-OR gate 252. LPF2 block 220 is a conventional low pass filter. In this embodiment, the CTL block 222 is a varactor 260 whose capacitance alters the frequency and phase of the RTWO2 204 in FIG. 2A.

The exclusive-OR gate 252 operates to determine the phase difference between the two RTWOs 202, 204. If the RTWOs 202, 204 are in phase alignment (zero phase difference), then the output of the XOR gate 252 is close to zero volts, which is designed to correspond to a no-load condition. If the RTWOs 202, 204 are 90 degrees out of phase, then the output of the XOR gate 252 is approximately VOH/2, which is designed to correspond to a maximum load condition. As described above, the output of the XOR gate 252 is filtered and applied to a first input of the second error amplifier 258, which compares the first input to the second input, received from the first error amplifier 256. Thus, a voltage error (Verror) 262 between the reference 264 and the scaled output 266 creates a finite-size output pulse from the XOR gate 252, which attempts to remove the voltage error 264, via negative feedback.

Block PW 228 in FIGS. 2A and 2B combines selected output taps of RTWO1 202 and RTWO2 204. The output 229 of the PW block 228 is thus a pulse whose width is modulated by the input Vin 224. FIG. 2D shows an embodiment 270 of the PW block. Instead of using a single switching transistor, two transistors 272, 274 are used in series. The top transistor in the series receives the output of RTWO1 202. The bottom transistor receives the output of RTWO2 204. The pair of transistors 276 has an on time that is the overlap of the two RTWO outputs, as shown. An alternative to two transistors is a single transistor with dual gates (MOSFET) or bases (BJT), although such transistors are less common.

FIG. 2B shows an alternative design 240 in which the phase offset is digitally controlled. In this embodiment, the operation of RTWO1 202 is the same as in the embodiment of FIG. 2A. The blocks for controlling the phase offset derived from RTWO2 are different. These blocks include a PD2 block 242, an LPF2 block 246, a CTL2 block 248, an A/D block 243, and a PS (Phase Selector) block 247. The PD2 block 242 determines the phase difference between RTWO1 202 and RTWO2 204. The LPF2 block 246 receives the output of the PD2 block 242 and filters it. The CTL2 block 248 adjusts the frequency and/or phase of RTWO2 204. The A/D block converts 243 the input voltage to a digital value 245. The PS block 247 selects one of the phases of RTWO2 204 according to the digital value 245 from the A/D block 243. Therefore, the Verror signal controls the phase offset from RTWO2 204 by selecting it in a phase selector 247. The PW block then combines the output of RTWO1 and RTWO2 to create the desired pulse.

Figure 3:
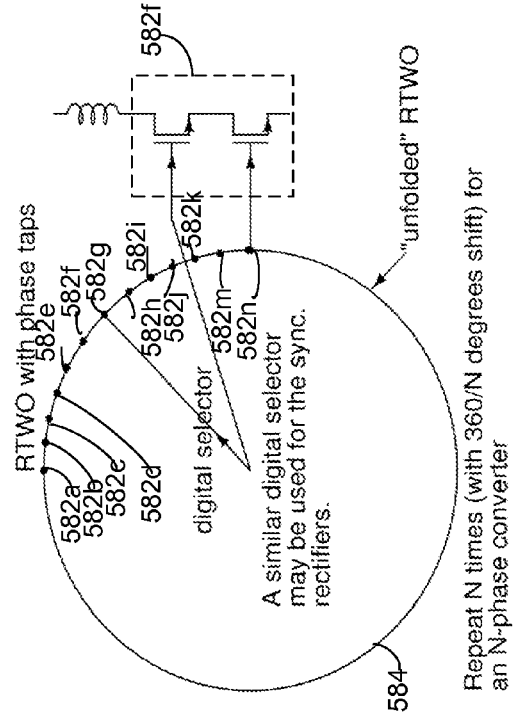
FIG. 3 a conceptual version of the embodiment of FIG. 2C.

FIG. 2C shows a more simple embodiment 300 for digitally controlling the pulse width, which is illustrated conceptually in FIG. 3. This embodiment includes an A/D block 302, a PS block 304 and a PW block 306, along with a single RTWO 308. The A/D block 302 receives the voltage Verror 310 to generate a digital version [d1, d2, . . . , dn] 312 of the control voltage. The digital version of the control voltage [d1, d2, . . . , dn] 312 operates to select one of N phases tapped directly from the RTWO 308 via the PS block 304. The PW block 306 receives the selected phase 316 from the RTWO 308 along with a phase from a fixed tap 314 of the RTWO and operates to combine the phases to create the desired pulse width.

Power Converter Design

Figure 4A:
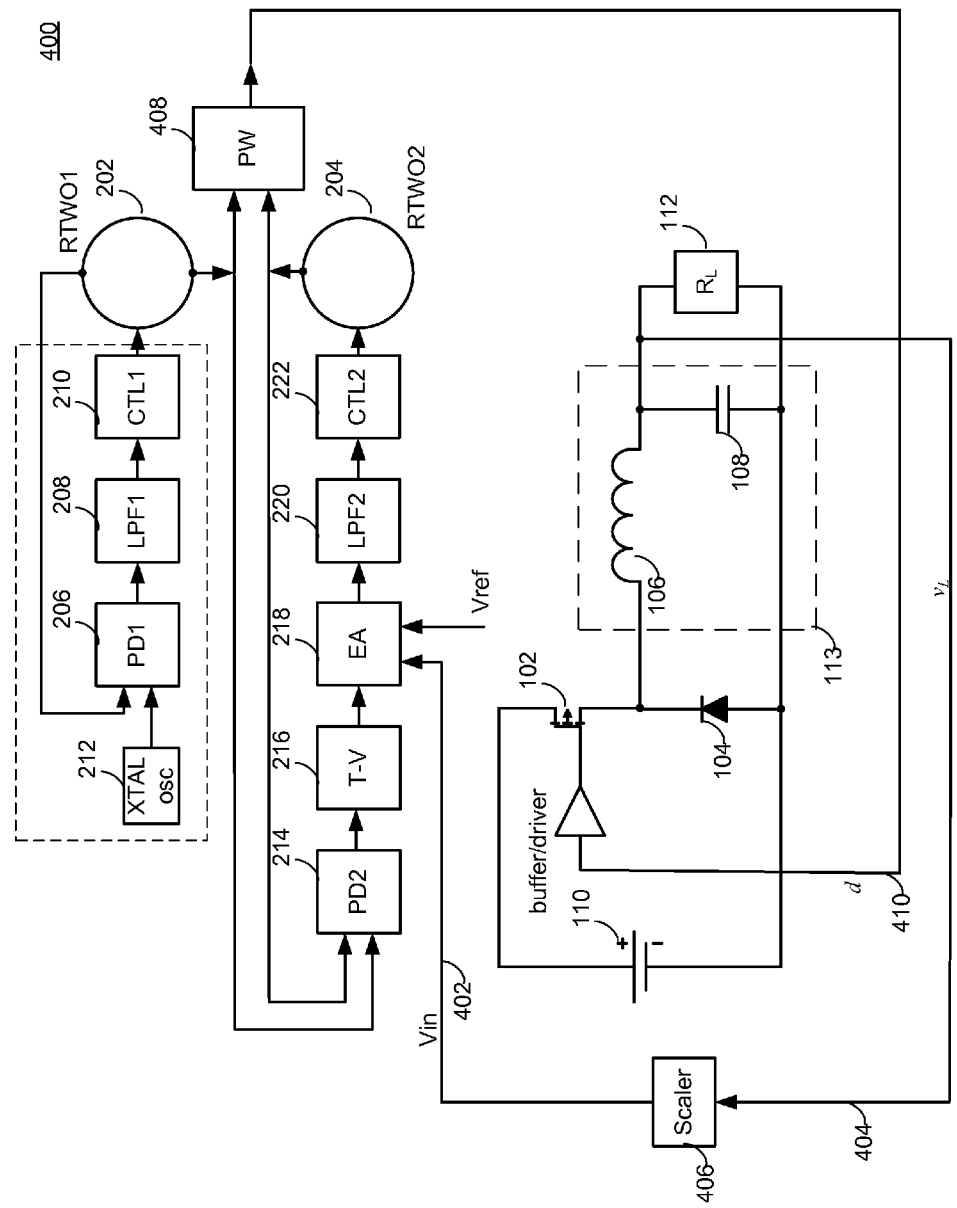
FIG. 4A shows a power converter using an embodiment of PWM of the present invention.

FIG. 4A shows the pulse width modulator used in a power converter 400. The input voltage Vin 402 connects to the output voltage 404 of the converter via a scaler block 406, which may increase or decrease the load voltage 404, and the output of the PW block 408 connects to the duty cycle input d 410 of the converter, as shown.

Figure 4B:
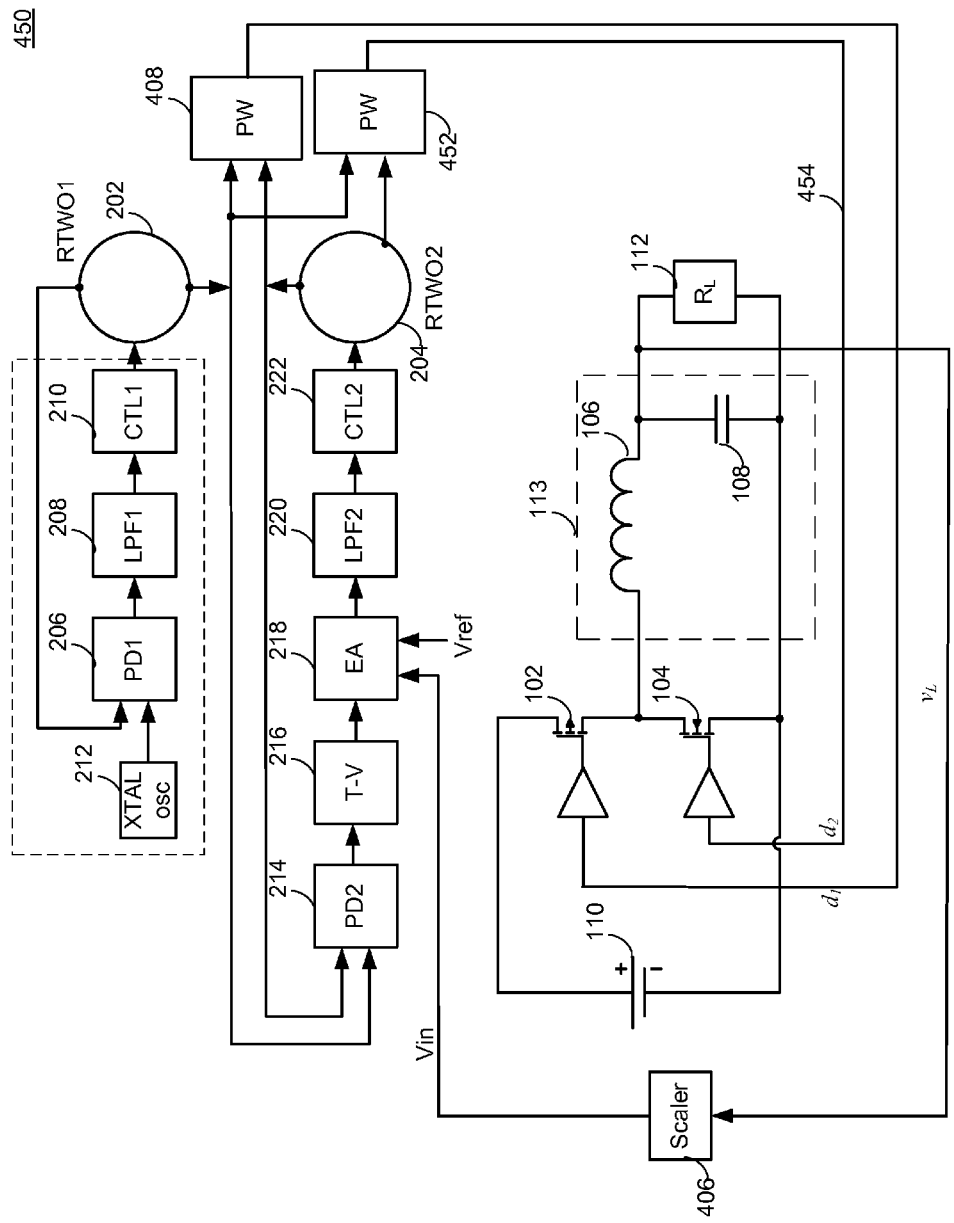
FIG. 4B shows a power converter using an embodiment of the PWM of the present invention.

FIG. 4B shows the pulse width modulator used in a power converter with a synchronous rectifier 104. In FIG. 4B, a second PW block 452 is added to form the duty cycle signal 454 for operating the synchronous transistor 104.

Figure 4C:
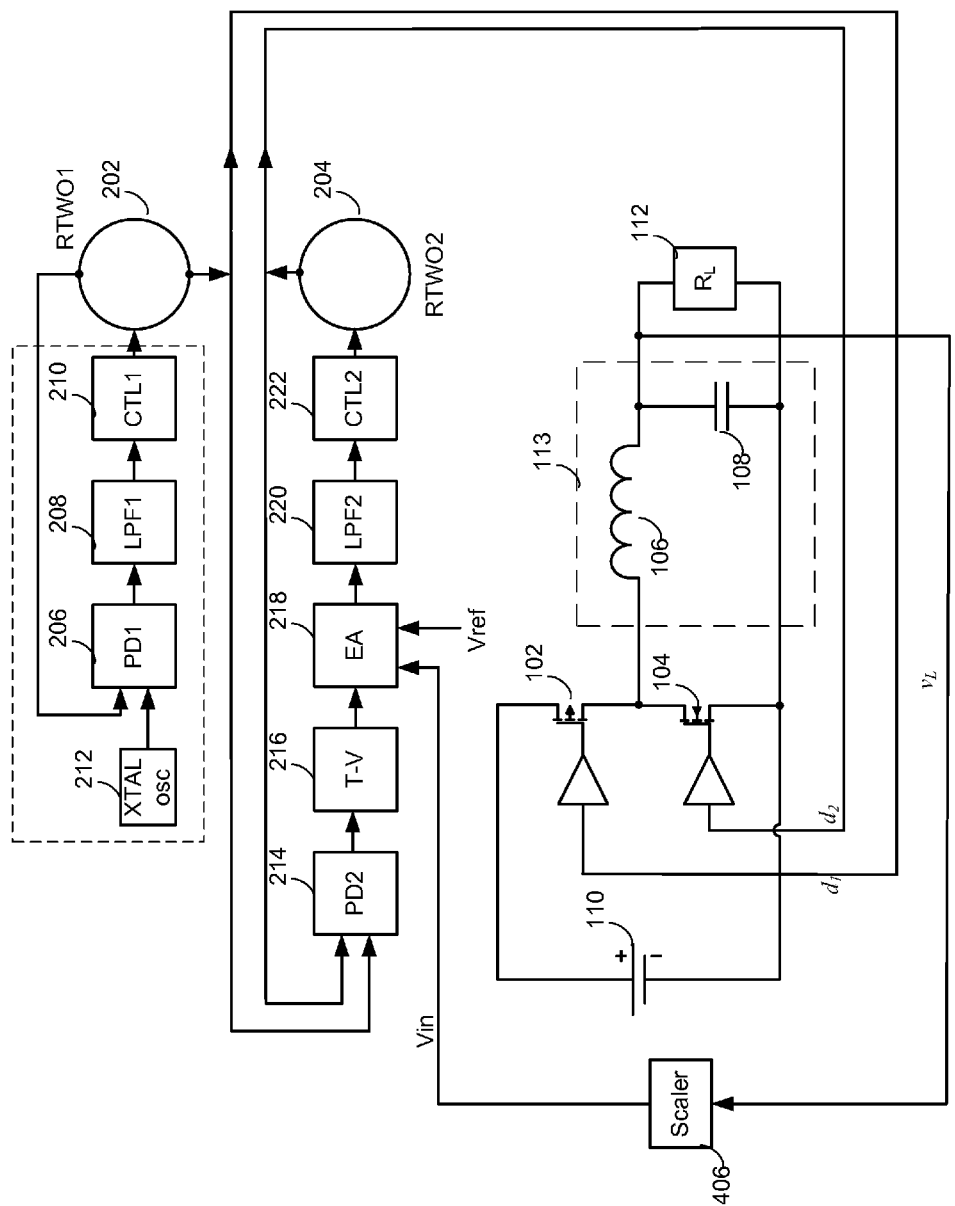
FIG. 4C shows a power converter using yet another embodiment of the PWM of the present invention.

FIG. 4C shows a pulse width modulator used in a power converter 480 with a synchronous rectifier. In FIG. 4C, the output of each RTWO 202, 204 operates the switching transistor 102 and synchronous rectifier 104 directly, eliminating the need for the PW blocks.

Figure 4D:
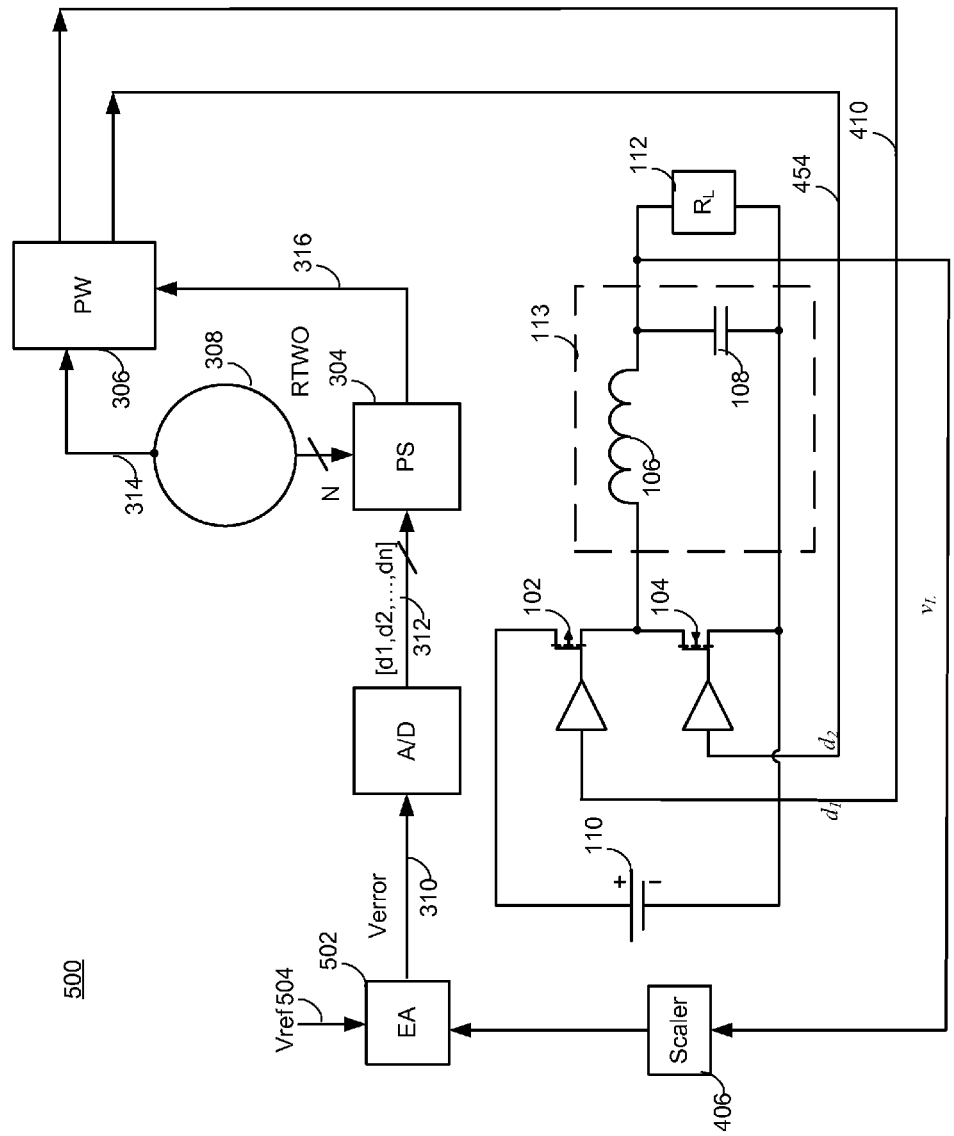
FIG. 4D shows a power converter using yet another embodiment of the PWM of the present invention.

FIG. 4D shows a pulse width modulator used in a power converter 500 with a synchronous rectifier 104. The pulse width modulator uses a digital selection 312 for the phase based on the error voltage 310 from the error amplifier 502, in accordance with the design in FIG. 2C. Error amplifier receives input from Vref 504 and the scaler 406 to create the Verror signal 310.

Figure 4E:
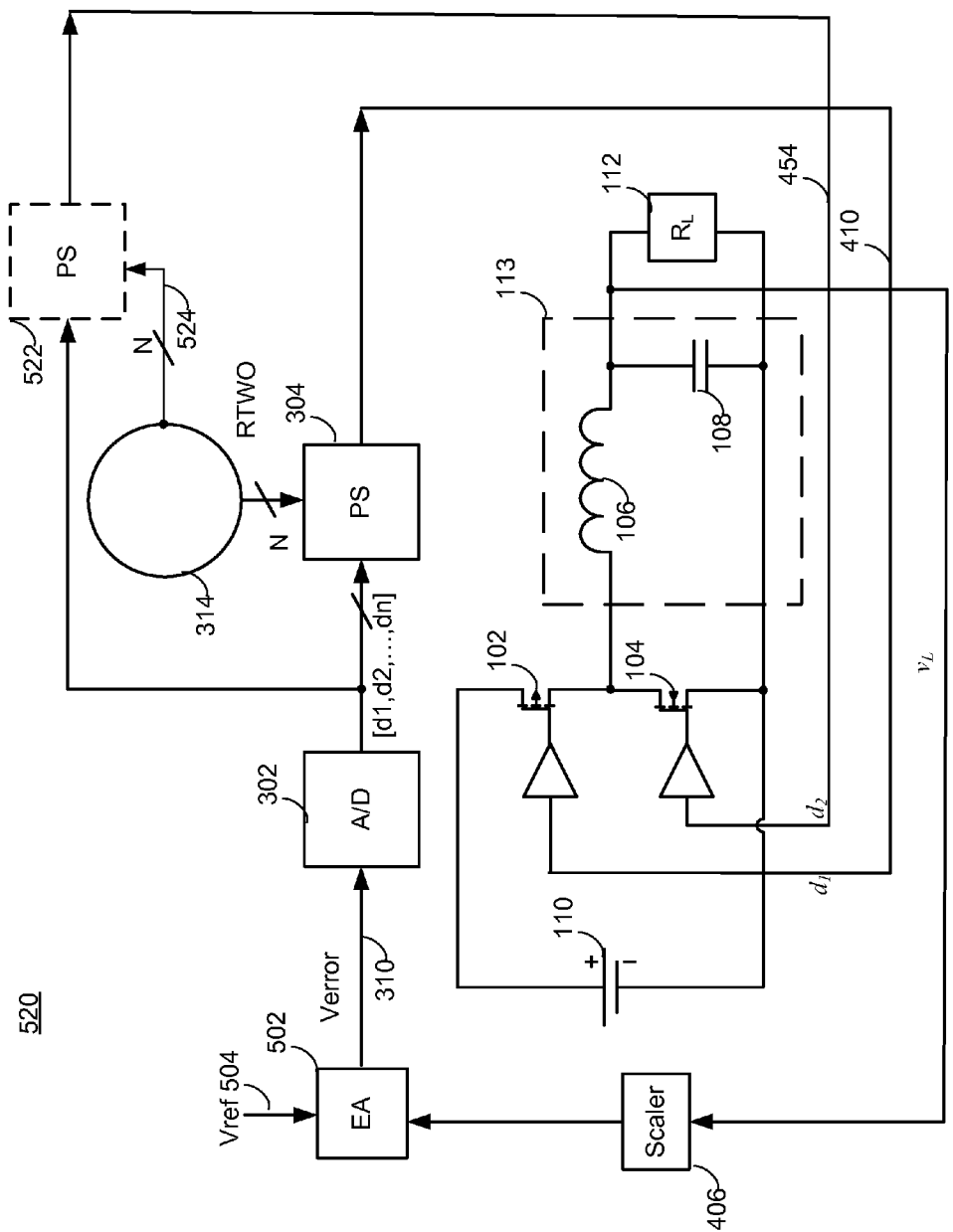
FIG. 4E shows a power converter using yet another embodiment of the PWM of the present invention.

FIG. 4E shows a pulse width modulator used in a power converter 520 with a synchronous rectifier 104. The pulse width modulator uses a digital selection 312 for the phase based on the error voltage 310, in accordance with the design in FIG. 3. In FIG. 4E, it should be noted that not only can the main switching transistor 102 be controlled by the digital phase selector, the synchronous rectifier transistor 104 could also be controlled in the same manner, i.e., by adding a separate phase selector PS circuit 522 that receives the output of the A/D converter 312 and N taps 524 from the RTWO 314.

Multiphase Power Converter

Figure 5:
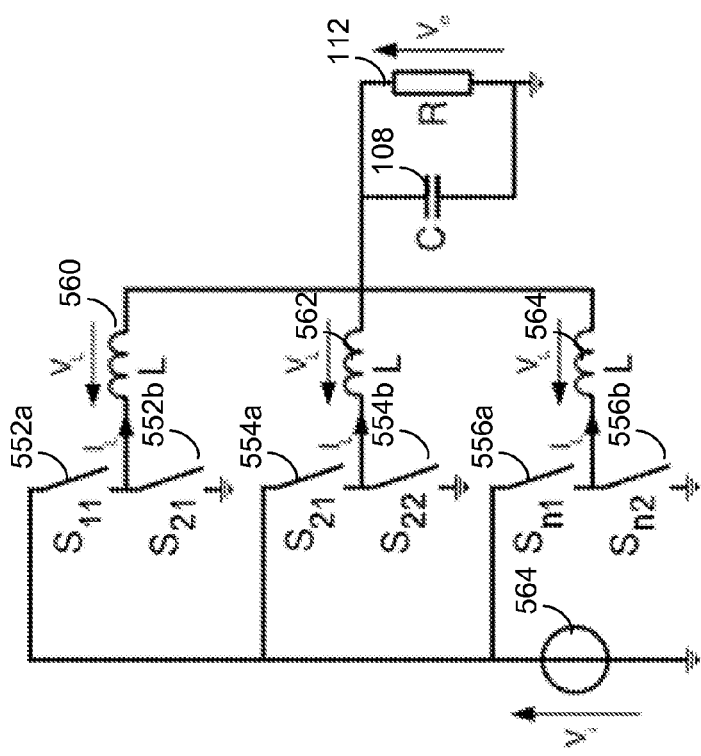
FIG. 5 shows a multiphase converter.

Yet another embodiment 550 of the present invention is a multiphase power converter. A portion of such a converter is shown in FIG. 5. Each of the switches 552a,b 554a,b 556a,b charges and discharges inductors 560, 562, 564 via voltage and current source 564 shown and can be controlled by a PW block derived from pulse width modulator of the present invention or directly from an RTWO, in accordance with FIG. 4A, 4B, 4C, 4D, or 4E. The design 580 in FIG. 3 can also be used as a PWM for a multiphase converter, by using taps 582a-n from the RTWO 584 that are spaced 360/N degrees apart for an N phase converter.

Although the present invention has been described in considerable detail with reference to certain preferred versions thereof, other versions are possible. Therefore, the spirit and scope of the appended claims should not be limited to the description of the preferred versions contained herein.

What is claimed is:

1. A pulse width modulator comprising:
a first rotary traveling wave oscillator oscillating at a predetermined frequency and having an oscillator signal at a first output tap and a feedback tap with a first phase;
a second rotary traveling wave oscillator oscillating at a second frequency and having an oscillator signal at a second output tap and a feedback tap with a second phase;
a voltage controlled capacitance device, receiving a voltage control signal that alters the capacitance of said device, said device connected to the second rotary traveling wave oscillator such that the capacitance of said device affects the frequency and phase of said second oscillator;
a phase detector that connects to the feedback taps from the first and second rotary traveling wave oscillators to determine any difference between the first phase and the second phase;
a time-to-voltage converter that converts any difference from the phase detector into a voltage;
an error amplifier that receives the voltage output of the time-to-voltage converter and an external input voltage to generate an error signal;
a low pass filter that filters the error signal from the error amplifier to generate the voltage control signal that tends to make the second frequency substantially the same as the predetermined frequency and the second phase adjustably offset from the first phase; and
a pulse width device that combines the oscillator signal at the first output tap and the oscillator signal at the second output tap to create a pulse whose width is a function of the input voltage.

2. The pulse width modulator as recited in claim 1, wherein the phase detector is an exclusive 'OR' gate having a first input connected to the feedback tap of the first oscillator and a second input connected to the feedback tap of the second oscillator.

3. The pulse width modulator as recited in claim 1, wherein the time-to-voltage converter is a low pass filter that receives the output from the phase detector to create a voltage that averages the phase detector over time.

4. The pulse width modulator as recited in claim 1, wherein the pulse width device includes a first transistor and a second transistor, each having a source, drain, gate, and channel between the drain and source, the channels of said first and second transistors being connected in series, the gate of the first transistor being connected to the first output tap and the gate of the second transistor being connected to the second output tap so that a conductive path through both transistors occurs when the oscillator signal at the first tap and the oscillator signal at the second tap overlap in time.

5. A power converter comprising:
a first rotary traveling wave oscillator (RTWO) configured to generate a first oscillator signal;
a second RTWO configured to generate a second oscillator signal;
a phase detector configured to determine a phase difference between the first and second oscillator signals;
a time-to-voltage converter configure to convert the phase difference into a phase voltage;
an error amplifier configured to generate an amplified voltage by amplifying a difference between the phase voltage and an error voltage; and a control block configured to control at least one of a phase or a frequency of the second RTWO based on the amplified voltage such that the phase difference between the first and second oscillator signals is controlled by the error voltage.

6. The power converter of claim 5, further comprising a pulse width block configured to generate a pulse signal by combining the first oscillator signal and the second oscillator signal.

7. The power converter of claim 6, wherein the pulse width block comprises a first transistor and a second transistor, wherein the first transistor includes a gate configured to receive the first oscillator signal and a channel, wherein the second transistor includes a gate configured to receive the second oscillator signal and a channel, wherein the channels of the first and second transistors are connected in series so that a conductive path through the first and second transistors is provided when the first oscillator signal and the second oscillator signal overlap in time.

8. The power converter of claim 5, wherein the error voltage corresponds to a difference between a reference voltage and an input voltage.

9. The power converter of claim 8, further comprising at least one switching transistor configured to control an output voltage of the power converter, wherein the power converter further comprises a scaler block configured to generate the input voltage by scaling the output voltage of the power converter.

10. The power converter of claim 9, wherein the first oscillator signal and the second oscillator signal operate to control a duty cycle of the at least one switching transistor.

11. The power converter of claim 5, wherein the first RTWO is configured to operate in a phase-locked loop such that the first oscillator signal is phase-locked to a reference oscillator signal.

12. The power converter of claim 5, wherein the phase detector comprises an exclusive-OR (XOR) gate having a first input configured to receive the first oscillator signal and a second input configured to receive the second oscillator signal.

13. The power converter of claim 12, wherein the time-to-digital converter comprises a resistor-capacitor (RC) filter configured to generate the phase voltage by filtering an output of the XOR gate.

14. The power converter of claim 5, wherein the control block comprises a varactor having a capacitance configured to alter the phase and frequency of the second RTWO.

15. The power converter of claim 5, further comprising a low pass filter configured to filter the amplified voltage.

16. A method of controlling a duty cycle in a power converter, the method comprising:
generating a first oscillator signal using a first rotary traveling wave oscillator (RTWO);
generating a second oscillator signal using a second RTWO;
determining a phase difference between the first and second oscillator signals;
converting the phase difference into a phase voltage;
generating an amplified voltage by amplifying a difference between the phase voltage and an error voltage; and
controlling at least one of a phase or a frequency of the second RTWO based on the amplified voltage.

17. The method of claim 16, further comprising generating a pulse signal by combining the first oscillator signal and the second oscillator signal.

18. The method of claim 16, further comprising controlling a duty cycle of a switching transistor using the pulse signal.

19. The power converter of claim 16, wherein the error voltage corresponds to a difference between a reference voltage and an input voltage.

20. The power converter of claim 19, further comprising scaling an output voltage of the power converter to generate the input voltage.

* * * * *